US011665975B2

(12) United States Patent
Gosavi et al.

(10) Patent No.: US 11,665,975 B2
(45) Date of Patent: May 30, 2023

(54) SPIN ORBIT COUPLING MEMORY DEVICE WITH TOP SPIN ORBIT COUPLING ELECTRODE AND SELECTOR

(71) Applicant: Intel Corporation, Santa Clara, CA (US)

(72) Inventors: Tanay Gosavi, Hillsboro, OR (US); Chia-Ching Lin, Portland, OR (US); Sasikanth Manipatruni, Portland, OR (US); Ian Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 1033 days.

(21) Appl. No.: 16/012,673

(22) Filed: Jun. 19, 2018

(65) Prior Publication Data
US 2019/0386203 A1    Dec. 19, 2019

(51) Int. Cl.
*H01L 43/02* (2006.01)
*H01L 43/10* (2006.01)
*H01L 43/12* (2006.01)
*G11C 11/16* (2006.01)
*H01F 10/32* (2006.01)
*H01L 27/22* (2006.01)

(52) U.S. Cl.
CPC ............ H01L 43/02 (2013.01); G11C 11/161 (2013.01); H01F 10/329 (2013.01); H01F 10/3254 (2013.01); H01F 10/3286 (2013.01); H01L 27/224 (2013.01); H01L 27/228 (2013.01); H01L 43/10 (2013.01); H01L 43/12 (2013.01); *H01F 10/3272* (2013.01)

(58) Field of Classification Search
CPC ..... H01L 43/02; H01L 27/224; H01L 27/228; H01L 43/10; H01L 43/12; G11C 11/161; H01F 10/3254; H01F 10/3286; H01F 10/329; H01F 10/3272
USPC ........................................................ 257/421
See application file for complete search history.

(56) References Cited

U.S. PATENT DOCUMENTS

| 2019/0172999 | A1* | 6/2019 | Chia ................... H01F 10/3286 |
| 2020/0273864 | A1 | 8/2020 | Manipatruni et al. |
| 2020/0273866 | A1 | 8/2020 | Manipatruni et al. |
| 2020/0273867 | A1 | 8/2020 | Manipatruni et al. |
| 2020/0303343 | A1 | 9/2020 | Manipatruni et al. |
| 2020/0303344 | A1 | 9/2020 | Manipatruni et al. |
| 2020/0321344 | A1 | 10/2020 | Ramamoorthy et al. |
| 2020/0321472 | A1 | 10/2020 | Ramamoorthy et al. |
| 2020/0321473 | A1 | 10/2020 | Ramamoorthy et al. |
| 2020/0321474 | A1 | 10/2020 | Ramamoorthy et al. |
| 2021/0202507 | A1 | 7/2021 | Thareja et al. |
| 2021/0202510 | A1 | 7/2021 | Thareja et al. |
| 2021/0202689 | A1 | 7/2021 | Thareja et al. |
| 2021/0202690 | A1 | 7/2021 | Thareja et al. |
| 2021/0203324 | A1 | 7/2021 | Manipatruni et al. |

(Continued)

*Primary Examiner* — Jami Valentine Miller
(74) *Attorney, Agent, or Firm* — Essential Patents Group, LLP

(57) ABSTRACT

An apparatus is provided which comprises: a bit-line; a first word-line; a second word-line; and a source-line; a magnetic junction comprising a free magnet; an interconnect comprising spin orbit material, wherein the interconnect is adjacent to the free magnet of the magnetic junction; and a first device (e.g., a selector device) coupled at one end of the interconnect and to the second word-line; and a second device coupled to the magnetic junction, the first word-line and the source-line.

20 Claims, 9 Drawing Sheets

(56) References Cited

U.S. PATENT DOCUMENTS

| | | |
|---|---|---|
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

* cited by examiner

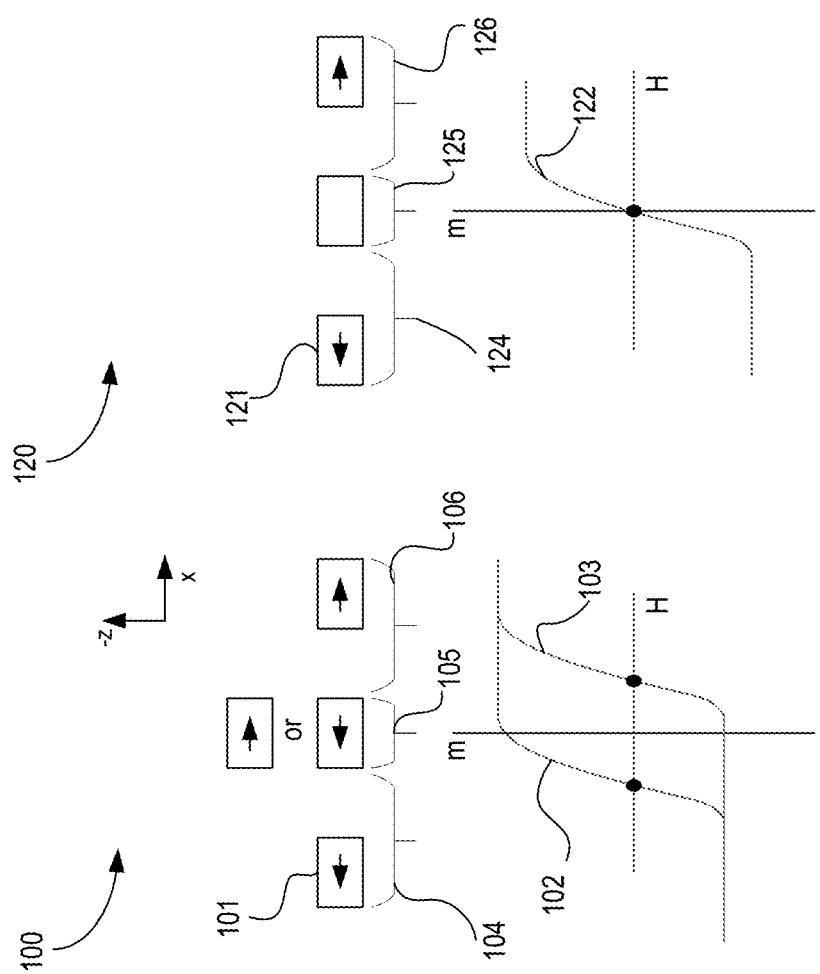

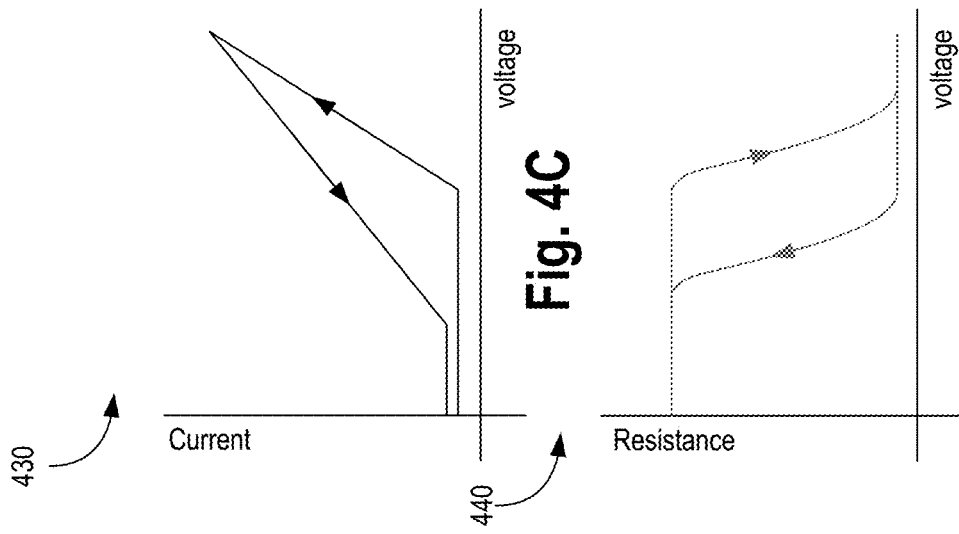
Fig. 4C
Fig. 4D
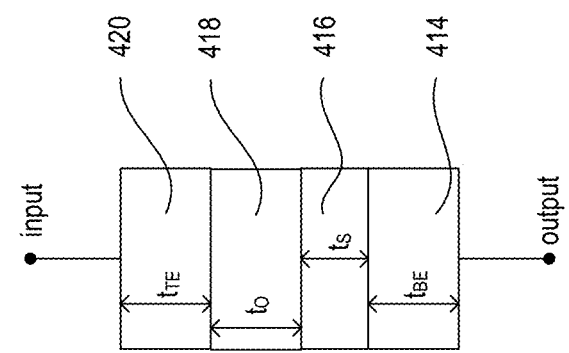
Fig. 4B
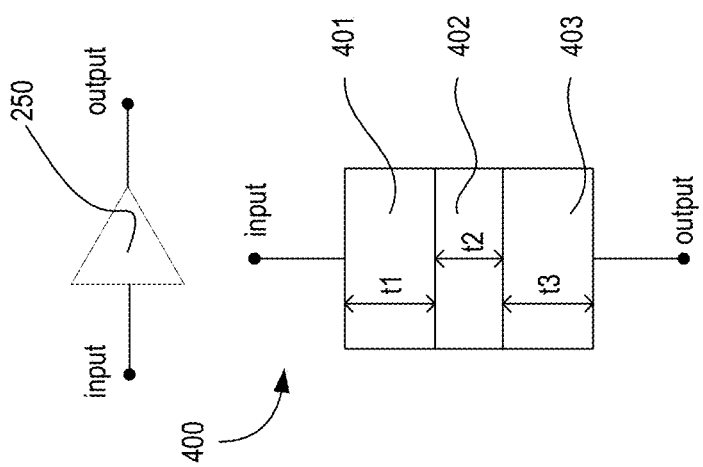
Fig. 4A

SPIN ORBIT COUPLING MEMORY DEVICE WITH TOP SPIN ORBIT COUPLING ELECTRODE AND SELECTOR

BACKGROUND

Perpendicular spin-orbit torque (pSOT) device is a promising replacement of an embedded static random access memory (e-SRAM). A pSOT device comprises a perpendicular magnetic tunneling junction (p-MTJ) stack on a spin orbit coupling (SOC) material. A pSOT is typically a three-terminal device that requires two access transistors coupled on either side of the SOC material for applying bidirectional current. This increases the area of the pSOT device based memory bit-cell and this limits the density of the pSOT based magnetic random access memory (MRAM).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates magnetization response to applied magnetic field for a ferromagnet.

FIG. 1B illustrates magnetization response to applied magnetic field for a paramagnet.

FIG. 4A illustrates a cross-sectional view of a selector which is coupled to a top SOC interconnect of the memory device, in accordance with some embodiments.

FIG. 4B illustrates a cross-sectional view of a selector (e.g., 250) which is coupled to a top SOC interconnect of the memory device, in accordance with some embodiments.

FIGS. 4C-D illustrate plots showing characteristics of the selector, in accordance with some embodiments.

DETAILED DESCRIPTION

Figure 2A:
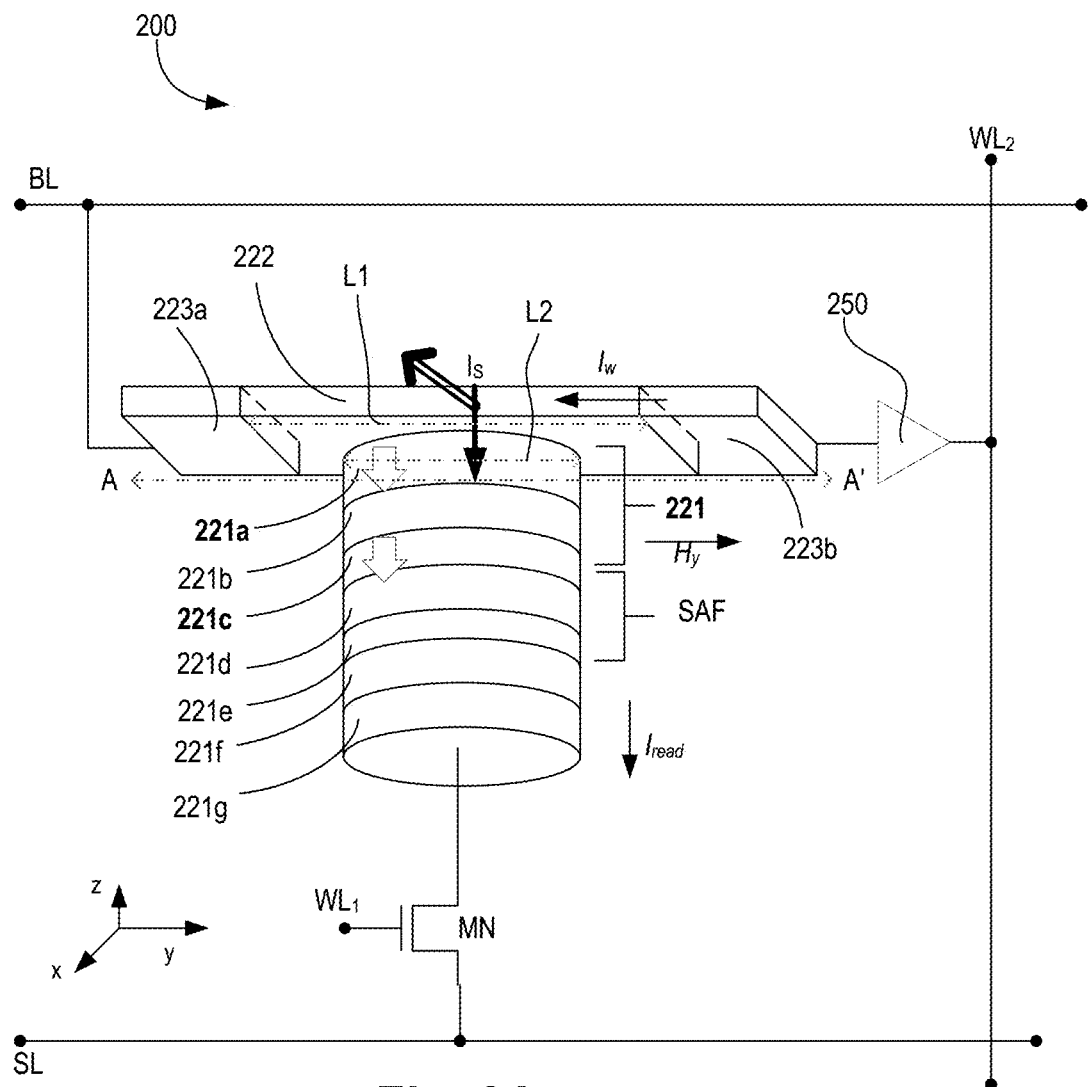
FIGS. 2A-B illustrate a three-dimensional (3D) view and corresponding top view, respectively, of a device having an out-of-plane MTJ stack coupled to a top spin orbit coupling (SOC) interconnect with selector, in accordance with some embodiments.

Various embodiments describe a spin orbit torque or coupling memory having a top spin orbit torque (SOT) electrode above a magnetic junction device, wherein the SOT electrode is coupled to a selector device. In some embodiments, the magnetic junction is a magnetic tunneling junction (MTJ) with magnets having perpendicular magnetic anisotropy. As such, 1T-1S (one transistor and one selector) SOT memory cell is formed.

There are many technical effects of the various embodiments. For example, the selector enables a top SOT device which allows for lower lead resistance and enables the use of well-developed spin transfer torque (STT) magnetic random access memory (MRAM) stacks for SOT devices. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque,).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees+/−20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back" "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

For the purposes of present disclosure, the terms "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described but are not limited to such.

FIG. 1A illustrates a magnetization hysteresis plot 100 for ferromagnet (FM) 101. The plot shows magnetization response to an applied magnetic field for ferromagnet 101. The x-axis of plot 100 is magnetic field 'H' while the y-axis is magnetization 'm'. For FM 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetization. In the zero magnetic field region 105 of the hysteresis loop, FM 101 does not have a definite value of magnetization, but rather depends on the history of applied magnetic fields. For example, the magnetization of FM 101 in configuration 106 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hetero-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

FIG. 1B illustrates magnetization plot 120 for paramagnet 121. Plot 120 shows the magnetization response to an applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

Figure 2B:
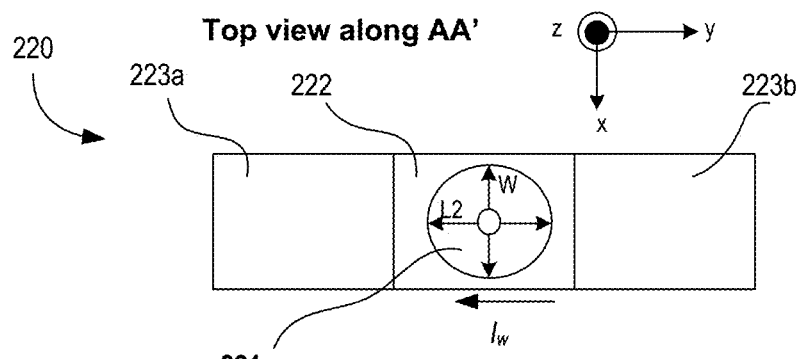

FIGS. 2A-B illustrate a three-dimensional (3D) view and corresponding top view, respectively, of a device having an out-of-plane magnetic junction stack coupled to a top spin orbit coupling (SOC) interconnect with selector, in accordance with some embodiments.

Here, the stack of layers having magnetic junction 221 is coupled to an electrode 222 comprising spin Hall effect (SHE) or SOC material (or spin orbit torque (SOT) material), where the SOC material converts charge current $I_W$ (or write current) to spin polarized current $I_S$. The device of FIG. 2A forms a three-terminal memory cell with SOC induced write mechanism and magnetic junction based read-out. Spin Hall effect is a relativistic spin-orbit coupling phenomenon that can be used to electrically generate or detect spin currents in non-magnetic systems.

When an in-plane current is applied to heavy-metal/ferromagnet bilayer systems, this in-plane current gives rise to spin accumulation in the magnet via spin-orbit interactions. The spin accumulation in the free magnet leads to torques (e.g., SOT) or effective fields acting on the magnetization, thus switching the magnetization of the free magnet. The SOT has two components with different symmetries—Slonczewski-like torque and field-like torque. The origin of the SOT is generally attributed to the bulk spin Hall effect in the heavy metal. The specific structures of the SOT switching scheme demonstrated here are categorized into two types according to the direction of the easy axis of the magnet.

FIG. 2A illustrates the easy axis to be out-of-plane and orthogonal to the current. For example, the easy axis to be perpendicular to the film plane (or device). The memory device of FIG. 2A comprises magnetic junction 221, spin orbit coupling (SOC) Interconnect or electrode 222, and non-magnetic metal(s) 223a/b. In one example, magnetic junction 221 comprises layers 221a, 221b, and 221c. In some embodiments, layers 221a and 221c are magnetic layers. In some embodiments, layer 221b is a metal or a tunneling dielectric.

For example, when the magnetic junction is a spin valve, layer 221b is metal or a metal oxide (e.g., a non-magnetic metal such as Al and/or its oxide) and when the magnetic junction is a tunneling junction, then layer 221b is a dielectric (e.g. MgO, $Al_2O_3$). One or both ends along the horizontal direction of SOC Interconnect 222 is formed of non-magnetic metals 223a/b. Additional layers 221d, 221e, 221f, and 221g can also be stacked on top of layer 221c. In some embodiments, layer 221g is a non-magnetic metal electrode.

So as not to obscure the various embodiments, the magnetic junction is described as a magnetic tunneling junction (MTJ). However, the embodiments are also applicable for spin valves. A wide combination of materials can be used for material stacking of magnetic junction 221. For example, the stack of layers 221a, 221b, 221c, 221d, 221e, 221f, and 221g are formed of materials which include: $Co_xFe_yB_z$, MgO, $Co_xFe_yB_z$, Ru, $Co_xFe_yB_z$, IrMn, and Ru, respectively, where 'x,' 'y,' and 'z' are fractions of elements in the alloys. Other materials may also be used to form MTJ 221. MTJ 221 stack comprises free magnetic layer 221a, MgO tunneling oxide 221b, a fixed magnetic layer 221c/d/e which is a combination of CoFe, Ru, and CoFe layers, respectively, referred to as Synthetic Anti-Ferromagnet (SAF), and an Anti-Ferromagnet (AFM) layer 221f. The SAF layer has the property, that the magnetization in the two CoFe layers are opposite, and allow for cancelling the dipole fields around the free magnetic layer such that a stray dipole field will not control the free magnetic layer.

In some embodiments, the magnetic memory device 200 includes an access transistor MN coupled to the contact 221g and the select line (SL). In some embodiments, the transistor MN is controllable by a first word-line ($WL_1$). The signal on the first word-line is provided by a word-line driver (not shown). In some embodiments, magnetic memory device 200 includes a bit-line (BL) which is coupled to conductor 223a. In some embodiments, magnetic memory device 200 comprises a selector 250 having an input coupled to conductor 223b and an output coupled to a second word-line ($WL_2$). The signal on the second word-line is provided by another word-line driver (not shown).

In some embodiments, selector 250 enables a top SOT device as shown. The top SOT configuration allows for lower resistance and enables the use of well-developed STT MRAM magnetic stacks for SOT devices. The selector 250 in combination with top SOT-MTJ device makes it 1-transistor—Selector 1-pSOT memory cell, in accordance with some embodiments.

The selector 250 can be integrated into a via (e.g., Via 4) and thus make the top SOT with selector based memory density comparable to STTM devices. This is 30 to 50% improvement in cell density. When a bias voltage is applied to selector 250 above the threshold voltage, the resistance of selector 250 switches from high resistance to low resistance. This switching in resistance allows current to flow through selector 250 which in turn enables the current flow to the SOT layer switching the free layer magnet in the MTJ. This needs the correct amplitude of voltage to be applied between the WL2 and the Bit line. The reverse polarity allows current to flow in the opposite direction once the bias above threshold voltage is applied.

In some embodiments, selector 250 is a two-terminal selector device comprising metal and oxygen. In some embodiments, the two-terminal device comprises: a first structure including metal (e.g., Pt, Ti, Ni, Zn, a compound of indium and titanium, etc.); a second structure including oxygen (e.g., $TiO_2$, NiOx); and a third structure including metal (e.g., Pt, Ti, Ni, Zn, a compound of indium and titanium, etc.), wherein the second structure is between the first and third structures. In some embodiments, selector 250 includes one or more of: Pt, Te, Mo, Se, S, O, Ti, Zn, In, Ga, Rh, Nb, or Sn. In some embodiments, selector 250 comprises of 2D materials that exhibit phase change behavior. In some embodiments, the 2D materials include one or more of: $PtTe_2$, $MoSe_2$, or $MoS_2$. In some embodiments, selector 250 includes $NbO_2$.

In some embodiments, SOT interconnect 222 is positioned in a backend-of-line (BEOL) of a die or near the BEOL of the die, while the magnetic junction is closer to a frontend-of-line (FEOL) of the die compared to SOT interconnect 222.

Here, the term "backend" or BEOL generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" or FEOL generally refers to a section of the die that includes the active region (e.g., where transistors are fabricated) and low-level metal layers and corresponding vias that are closer to the active region (e.g., metal layer 5 and below in the ten-metal stack die example).

In some embodiments, the free and fixed magnetic layers (221a and 221c, respectively) are ferromagnets (FMs) that are formed of CFGG (i.e., Cobalt (Co), Iron (Fe), Germanium (Ge), or Gallium (Ga) or a combination of them). In some embodiments, magnets 221a/c are formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

The thickness of a magnetic layer (e.g., fixed or free magnetic layer) may determine its equilibrium magnetization direction. For example, when the thickness of the ferromagnetic layer 221a/c is above a certain threshold (depending on the material of the magnet, e.g. approximately 1.5 nm for CoFe), then the ferromagnetic layer exhibits magnetization direction which is in-plane. Likewise, when the thickness of the ferromagnetic layer 221a/c is below a certain threshold (depending on the material of the magnet), then the ferromagnetic layer 221a/c exhibits magnetization direction which is perpendicular to the plane of the magnetic layer.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or $L1_0$-type of crystals, where $L1_0$ is a type of crystal class which exhibits perpendicular magnetization), can also determine the direction of magnetization.

In some embodiments, SOC interconnect 222 (or the write electrode) includes three-dimensional (3D) materials such as one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In some embodiments, SOC Interconnect 222 transitions into high conductivity non-magnetic metal(s) 223a/b to reduce the resistance of SHE Interconnect 222. The non-magnetic metal(s) 223a/b include one or more of: Cu, Co, α-Ta, Al, CuSi, NiSi, or graphene.

In FIG. 2A, the switching layer 221a (free magnet) has its easy axis along the out-of-plane (z) direction. For this type, an external field along the y-axis, $H_y$, is applied to break the symmetry and achieve bipolar switching. Assuming that the driving force for switching originates from the spin Hall effect in interconnect 222, the critical current density $J_C$ is given by:

$$J_c = \frac{2e}{h} \frac{M_s t_F}{\theta_{SH}^{eff}} \left( \frac{H_K^{eff}}{2} - \frac{H_y}{\sqrt{2}} \right)$$

where e is the elementary charge, h is the Dirac contact, $\theta_{SH}^{eff}$ is the effective spin Hall angle, and $M_s$, $t_F$, and $H_K^{eff}$ are the saturation magnetization, thickness and effective anisotropy field of the ferromagnet layer 321a, respectively.

In this example, the applied current $I_w$ is converted into spin current $I_s$ by SOC Interconnect 222. This spin current switches the direction of magnetization of the free layer and thus changes the resistance of MTJ 221. However, to read out the state of MTJ 221, a sensing mechanism is used to sense the resistance change.

The magnetic cell is written by applying a charge current via SOC Interconnect 222. The direction of the magnetic writing in free magnet layer 221a is decided by the direction of the applied charge current. Positive currents (e.g., currents flowing in the +y direction) produce a spin injection current with transport direction (along the +z direction) and spins pointing to the +x direction. The injected spin current in turn produces spin torque to align the free magnet 221a (coupled to the SOC layer 222 of SHE material) in the +z direction. Negative currents (e.g., currents flowing in the −y direction) produce a spin injection current with transport direction (along the −z direction) and spins pointing to the −x direction. The injected spin current in-turn produces spin torque to align the free magnet 221a (coupled to the SHE material of layer 222) in the −z direction.

In some embodiments, in materials with the opposite sign of the SHE/SOC effect, the directions of spin polarization and thus of the free layer magnetization alignment are reversed compared to the above.

In some embodiments, the magnets 221a and/or 221c are paramagnets. In some embodiments, the magnets 221a and/or 221c can be a combination of ferromagnets or paramagnets. For example, magnet 221a is a ferromagnet while magnet 221c is a paramagnet. In another example, magnet 221c is a ferromagnet while magnet 221a is a paramagnet.

Here free and fixed magnet layers (or structures) 221a and 221c, respectively, have perpendicular magnetic anisotropy (PMA). For example, fixed magnet structure 221c has a magnetization pointing along the z-direction and is perpendicular to the x-y plane of the device 200. Likewise, fixed magnet structure 221a has a magnetization pointing along the z-direction and is perpendicular to the x-y plane of the device 200.

In some embodiments, the magnets with PMA comprise a stack of materials, wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; and materials with tetragonal crystal structure. In some embodiments, the magnet with PMA is formed of a single layer of one or more materials. In some embodiments, the single layer is formed of MnGa.

$L1_0$ is a crystallographic derivative structure of an FCC (face centered cubic lattice) structure and has two of the faces occupied by one type of atom and the corner and the other face occupied with the second type of atom. When phases with the $L1_0$ structure are ferromagnetic the magnetization vector usually is along the [0 0 1] axis of the crystal. Examples of materials with $L1_0$ symmetry include CoPt and FePt. Examples of materials with tetragonal crystal structure and magnetic moment are Heusler alloys such as CoFeAl, MnGe, MnGeGa, and MnGa.

In some embodiments, the free and fixed magnetic layers (221a and 221c, respectively) are ferromagnets (FMs) that are formed of CFGG. In some embodiments, FM 421a/c are formed from Heusler alloys.

In some embodiments, the magnets 221a and/or 221c can be a combination of ferromagnets or paramagnets. For example, magnet 221a is a ferromagnet while magnet 421c is a paramagnet. In another example, magnet 221c is a ferromagnet while magnet 221a is a paramagnet. In some embodiments, magnets 221a and/or 221c are paramagnets.

In some embodiments, SOT interconnect 222 comprises a spin orbit 2D material which includes one or more of: graphene, $TiS_2$, $WS_2$, $MoS_2$, $TiSe_2$, $WSe_2$, $MoSe_2$, $B_2S_3$, $Sb_2S_3$, $Ta_2S$, Re-ST, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In some embodiments, the SOT interconnect 222 comprises spin orbit material which includes one of a 2D material or a 3D material, wherein the 3D material is thinner than the 2D material. In some embodiments, the SHE interconnect 222 comprises a spin orbit material which includes materials that exhibit Rashba-Bychkov effect.

In some embodiments, the 2D materials include one or more of: Mo, S, W, Se, Graphene, $MoS_2$, $WSe_2$, $WS_2$, or $MoSe_2$. In some embodiments, the 2D materials include an absorbent which includes one or more of: Cu, Ag, Pt, Bi, Fr, or H absorbents. In some embodiments, the SOC structures comprise a spin orbit material which includes materials that exhibit Rashba-Bychkov effect. In some embodiments, material which includes materials that exhibit Rashba-Bychkov effect comprises materials $ROCh_2$, where 'R' includes one or more of: La, Ce, Pr, Nd, Sr, Sc, Ga, Al, or In, and where "Ch" is a chalcogenide which includes one or more of: S, Se, or Te.

In some embodiments, SOC interconnect 222 comprises a lattice structure of a chiral AFM material $Mn_3Sn$. The chiral AFM based SOC electrode further improves the efficiency of switching the free magnet of the magnetic memory device. The chiral antiferromagnetic state of various embodiments has a very weak and soft ferromagnetic moment of about 0.002 Bohr magnetons per Mn atom, allowing switching the sign of the Hall effect with a small magnetic field of around a few hundred Oersted.

One benefit of the chiral ordering of the spins in the chiral AFM based SOC electrode is that the use of traditional assist current needed to cause the SOC electrode 222 attached to the magnetic junction to cause the free magnet 221a of the magnetic junction to switch, may no longer be needed. As such, low power and efficiency switching of the free magnet 221a of the magnetic junction is achieved using AFM materials for the SOC electrode.

In some embodiments, the free magnet 221a comprises at least two free magnets with a coupling layer between them, where one of the free magnet couples to (or is adjacent to) chiral AFM based SOC electrode 222 or regular SOC electrode 222. In some embodiments, the coupling layer includes one or more of: Ru, Os, Hs, Fe, or other transition metals from the platinum group of the periodic table.

In some embodiments, chiral AFM based SOC electrode 722 comprises chiral AFM such as $Mn_3X$ class of materials, where 'X' is one of Ge, Sn, Ga, Ir, Rh, or Pt. The $Mn_3X$ materials exhibit a non-collinear AFM order which, to avoid geometrical frustration, forms planes of Mn moments that are arranged in a Kagome-type lattice. With respect to these Kagome planes, in some embodiments, both the anomalous Hall conductivity (AHC) and the spin Hall conductivity (SHC) are quite anisotropic for any of these materials.

In some embodiments, chiral AFM based SOC electrode 222 is a Kagomi Chiral AFM. Examples of materials for Kagomi Chiral AFM include materials such as $Mn_3Sn$. Other examples include class-1 S-1/2 Kagomi AFMs, class-2 S-1/2 hyper Kagomi AFMs, and Metallo-organics. Class-1 S-1/2 Kagomi AFM includes material such as: $Cs_2Cu_3MF_{12}$, $Rb2Cu3SnF12$, and $X_2Cu_3MF_{12}$, where M=Zr, Hf, or Sn. Class-2 S-1/2 hyper Kagomi AFM includes material such as: $Na4Ir_3O_8$, $CuFeO_2$, $NaFeO_2$, $MnBr_2$, $SrCr_xFa_{12-x}O_{19}$, where 'x' is a number. Metallo-organics includes material such as: $Na_2Ba_3[Fe_3^{II}(C_2O_4)_6][A^{IV}(C_2O_4)_3]$, where $A^{IV}$ is one of $Sn_{IV}$ or $Zr^{IV}$, and $Na_2Ba_3[Fe_3^{II}(C_2O_4)_6][A^{III}(C_2O_4)_3]_{0.5}[A^{III}(C_2O_4)_3]_2 \times (H_2O)_2]_{0.5}$, where $A^{III}$ is one of $Fe^{III}$ or $Al^{III}$. In some embodiments, the Kagomi Chiral AFM material has a thickness tSOC in a range of 1 nm to 25 nm. In various embodiments, Chiral AFM based SOC electrode 222 applies SOT directly to the free layer 221a.

In some embodiments, free and/or fixed magnets 221a/c comprises a composite stack of multi-layers. In some embodiments, the multiplayers include 'n' layers of a first material and a second material. For example, the composite stack comprises layers of first and second materials stacked in an alternating manner, where 'n' has a range of 1 to 10. In some embodiments, the first material includes one of: Co, Ni, Fe, or an Heusler alloy. In some embodiments, the second material includes one of: Pt, Pd, Ir, Ru, or Ni. In some embodiments, the first material has a thickness t1 in a range of 0.6 nm to 2 nm. In some embodiments, the second material has a thickness t2 in a range of 0.1 nm to 3 nm.

Figure 3A:
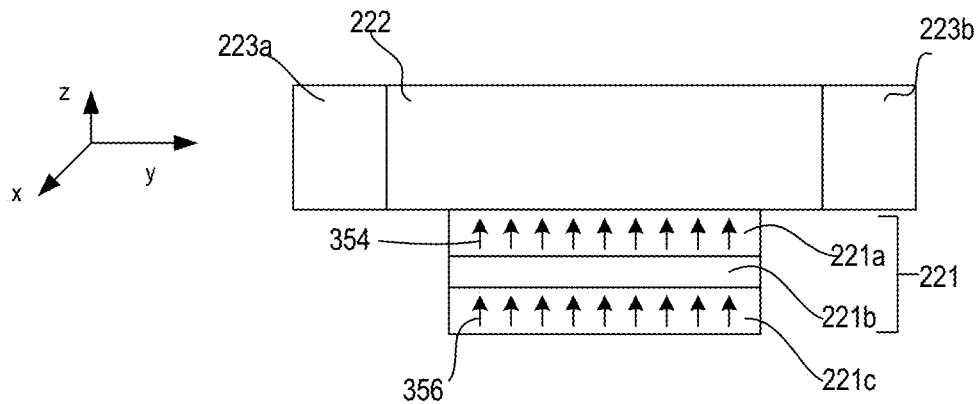
FIGS. 3A-C illustrate mechanisms for switching an out-of-plane MTJ memory device (e.g. device of FIG. 2A) formed on a top spin orbit torque electrode with selector, in accordance with some embodiments.
Figure 3B:
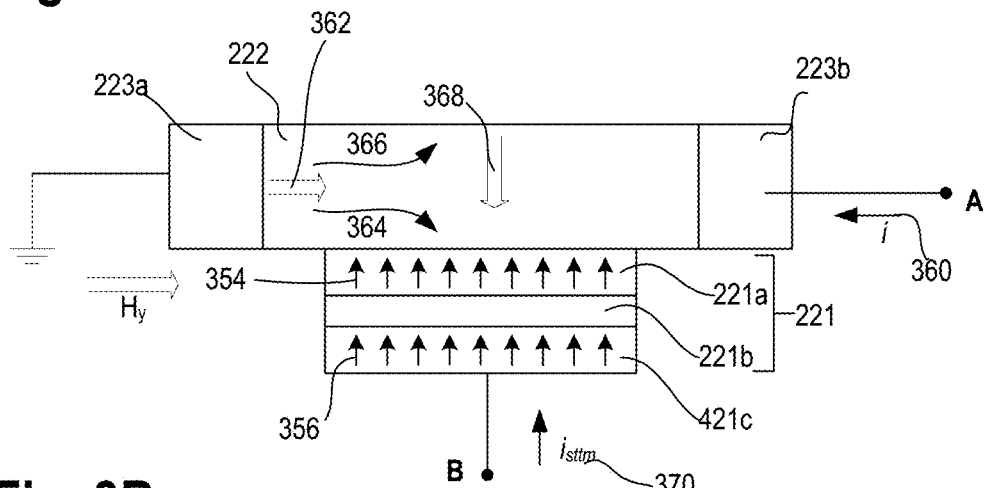
Figure 3C:
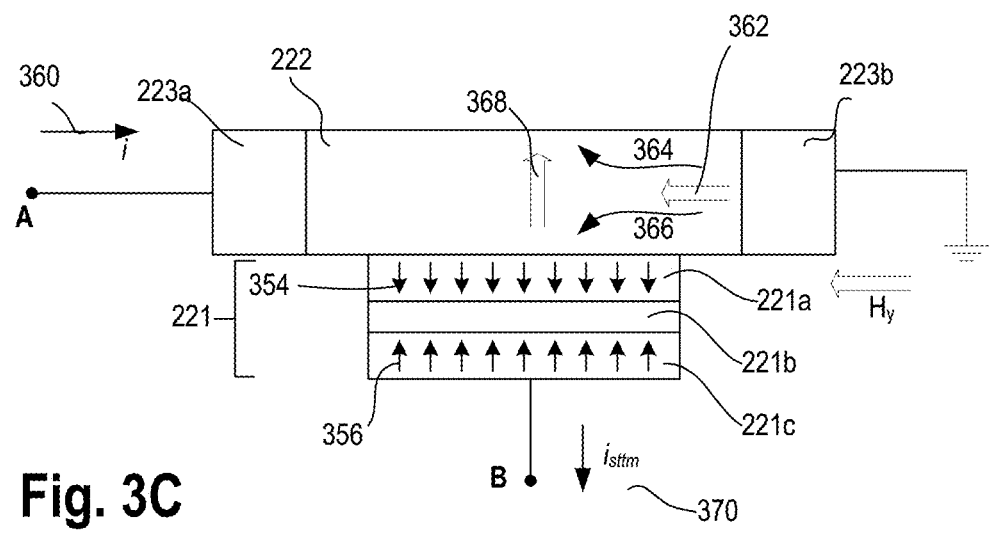

FIGS. 3A-C illustrate a mechanism for switching an out-of-plane MTJ memory device (e.g. device of FIG. 2A) formed on a top spin orbit torque electrode with selector, in accordance with some embodiments.

FIG. 3A illustrates an MTJ memory device (e.g., device 200) where MTJ 221 is disposed on a spin orbit torque (SOT) electrode 222, and where a magnetization 354 of the free magnet 221a (also referred to as storage layer 221a) is in the same direction as a magnetization 356 of the fixed magnet 221c. In some embodiments, the direction of magnetization 354 of the storage layer 221a and the direction of magnetization 356 of the fixed magnet 221c are both in the negative z-direction as illustrated in FIG. 3A. When the magnetization 354 of the storage layer 221a is in the same direction as a magnetization 356 of the fixed magnet 221c, MTJ memory device 200 is in a low resistance state. Conversely, when the magnetization 354 of the storage layer 221a is in the opposite direction as a magnetization 356 of the fixed magnet 221c, MTJ memory device 200 is in a high resistance state.

FIG. 3B illustrates a SOT memory device (e.g., device 200) switched to a high resistance state. In an embodiment, a reversal in the direction of magnetization 354 of the storage layer 221a in FIG. 3B compared to the direction of magnetization 354 of the storage layer 221a is brought about by (a) inducing a spin hall current 368 in the spin orbit torque electrode 222 in the y-direction and (b) by applying a spin torque transfer current 370, $i_{STTM}$, (by applying a positive voltage at terminal B with respect to ground C), and/or (c) by applying an external magnetic field, $H_y$, in the y-direction.

In an embodiment, a charge current 360 is passed through the spin orbit torque electrode 222 in the negative y-direction (by applying a positive voltage at terminal A with respect to ground C). In response to the charge current 360, an electron current 362 flows in the positive y-direction. The electron current 362 includes electrons with two opposite spin orientations and experience a spin dependent scattering phenomenon in the spin orbit torque electrode 222.

The electron current 362 includes electrons with two opposing spin orientations, a type I electron 366, having a spin oriented in the negative x-direction and a type II electron 364 having a spin oriented in the positive x-direction. In some embodiments, electrons constituting the electron current 362 experience a spin dependent scattering phenomenon in the spin orbit torque electrode 222. The spin dependent scattering phenomenon is brought about by a spin-orbit interaction between the nucleus of the atoms in the spin orbit torque electrode 222 and the electrons in the electron current 362. The spin dependent scattering phenomenon causes type I electrons 366, whose spins are oriented in the negative x-direction, to be deflected upwards towards an uppermost portion of the spin orbit torque electrode 222 and type II electrons 364 whose spins are oriented in the positive x-direction to be deflected downwards towards a lowermost portion of the spin orbit torque electrode 222.

The separation between the type I electron spin angular moment 366 and the type II electron spin angular moment 364 induces a polarized spin diffusion current 368 in the spin orbit torque electrode 222. In some embodiments, the polarized spin diffusion current 368 is directed upwards toward the free magnet 221a of the MTJ memory device 200 as depicted in FIG. 3B. The polarized spin diffusion current 368 induces a spin hall torque on the magnetization 354 of the free magnet 221a. The spin hall torque rotates the magnetization 354 to a temporary state pointing in the negative x-direction. In some embodiments, to complete the magnetization reversal process an additional torque is applied. The $i_{STTM}$ current 370 flowing through the MTJ memory device 200 exerts an additional torque on the magnetization 354 of the storage layer 221a. The combination of spin hall torque and spin transfer torque causes flipping of magnetization 354 in the storage layer 221a from the intermediate magnetization state (negative x-direction) to a positive z-direction illustrated in FIG. 3B. In some embodiments, an additional torque can be exerted on the storage layer 221a by applying an external magnetic field, $H_y$, in the y-direction, as illustrated in FIG. 3B, instead of applying an $i_{STTM}$ current 370.

FIG. 3C illustrates a SOT memory device switched to a low resistance state. In an embodiment, a reversal in the direction of magnetization 354 of the storage layer 221a in FIG. 3C compared to the direction of magnetization 354 of the storage layer 221a in FIG. 3B is brought about by (a) reversing the direction of the spin hall current 368 in the spin orbit torque electrode 222 and (b) by reversing the direction of the $i_{STTM}$ current 370, and/or (c) by reversing the direction of the external magnetic field, $H_y$.

FIG. 4A illustrates a cross-sectional view of a selector 400 (e.g., 250) which is coupled to a top SOC interconnect of the memory device, in accordance with some embodiments. In some embodiments, selector 400 is a two-terminal device comprising metal and oxygen. In some embodiments, the two-terminal device 400 comprises a first structure 401 including metal (e.g., Pt, Ti, Ni, Cu, Zn, a compound of indium and titanium, etc.). In some embodiments, the first structure has a thickness t1 in a range of 5 nm to 30 nm. In some embodiments, first structure 401 comprises indium-titanium-oxide (ITO), p-doped $NiO_x$, p-doped ZnO, or p-doped $CuO_x$.

In some embodiments, the two-terminal device 400 comprises a second structure 402 including oxygen (e.g., TiO2, NiOx). In some embodiments, the second structure 402 has a thickness t2 in a range of 5 nm to 30 nm.

In some embodiments, the two-terminal device 400 comprises a third structure 403 including metal (e.g., Pt, Ti, Ni, Zn, a compound of indium and titanium, etc.). In some embodiments, the third structure 403 has a thickness t3 in a range of 5 nm to 30 nm. In some embodiments, third structure 403 comprises one of: $InGaZnO_4$, n-doped $TiO_x$, or n-doped $InZnO_x$.

Here, the second structure 402 is between the first 401 and third 403 structures. In some embodiments, selector 400 includes one or more of: Pt, Te, Mo, Se, S, O, Ti, Zn, In, Ga, Rh, Nb, or Sn. In some embodiments, selector 400 comprises of 2D materials that exhibit phase change behavior. In some embodiments, the 2D materials include one or more of: $PtTe_2$, $MoSe_2$, or $MoS_2$. In some embodiments, selector 250 includes $NbO_2$. In some embodiments, selector 250 comprises a filamentary element. In some embodiments, selector 250 comprises homogenous stack of $NbO_{2-x}$ and $Nb_2O_{5-y}$. In some embodiments, selector 250 comprises heterogeneous stack of $NbO_{2-x}$ and $HfO_2$.

FIG. 4B illustrates a cross-sectional view of a selector (e.g., 250) which is coupled to a top SOC interconnect of the memory device, in accordance with some embodiments. In some embodiments, the selector device 400 is a resistive random access memory (RRAM) device. In some embodiments, the selector device 400 comprises a material stack which includes a bottom electrode (BE) 414, a switching layer 416 over the bottom electrode 414, an oxygen exchange layer 418 over the switching layer 416, and a top electrode (TE) 420 on the oxygen exchange layer 418. In some embodiments where selector device 400 is an RRAM-like or RRAM cell, a conductive filament bridges from top electrode 420 to the bottom electrode 414. As such, the selector device 400 is immediately conductive.

In some embodiments, bottom electrode 414 includes an amorphous conductive layer. In some embodiments, bottom electrode 414 is a topographically smooth electrode. In some embodiments, bottom electrode 414 includes a material such as W, Ta, TaN or TiN. In some embodiments, bottom electrode 414 is composed of Ru layers interleaved with Ta layers. In some embodiments, bottom electrode 414 has a thickness $t_{BE}$ in a range of 20 nm (nanometers) to 50 nm. In some embodiments, top electrode 420 includes a material such as W, Ta, TaN or TiN. In some embodiments, top electrode 420 has a thickness $t_{TE}$ in a range of 30 nm to 70 nm. In some embodiments, bottom electrode 414 and top electrode 420 are the same metal such as Ta or TiN.

In some embodiments, switching layer 416 may be a metal oxide, for example, including oxygen and atoms of one or more metals, such as, but not limited to Hf, Zr, Ti, Ta or W. In the case of titanium or hafnium, or tantalum with an oxidation state +4, switching layer 416 has a chemical composition, $MO_X$, where O is oxygen and X is or is substantially close to 2. In the case of tantalum with an oxidation state +5, switching layer 316 has a chemical composition, $M_2O_X$, where O is oxygen and X is or is substantially close to 5. In some embodiments, switching layer 416 has a thickness $t_S$ in a range of 1 nm to 5 nm.

In some embodiments, the oxygen exchange layer 418 acts as a source of oxygen vacancy or as a sink for $O_{2-}$. In some embodiments, oxygen exchange layer 418 comprises a metal such as but not limited to, hafnium, tantalum or titanium. In some embodiments, oxygen exchange layer 418 has a thickness to in a range of 5 nm to 20 nm. In some embodiments, the thickness of oxygen exchange layer 418 is at least twice the thickness of switching layer 416. In some other embodiments, the thickness of oxygen exchange layer 418 is at least twice the thickness of switching layer 416. In some embodiments, the selector device has a combined total thickness of the individual layers in a range of 60 nm to 100 nm and width in a range of 5 nm to 50 nm.

FIGS. 4C-D illustrate plots 430 and 440, respectively, showing characteristics of the selector, in accordance with some embodiments. Plot 430 shows an IV (current-voltage) plot of selector 250. Selector 250 shows hysteresis behavior. Plot 440 shows the change in resistance of selector 250 which changing applied voltage across its two terminals.

Figures 5A, 5B:
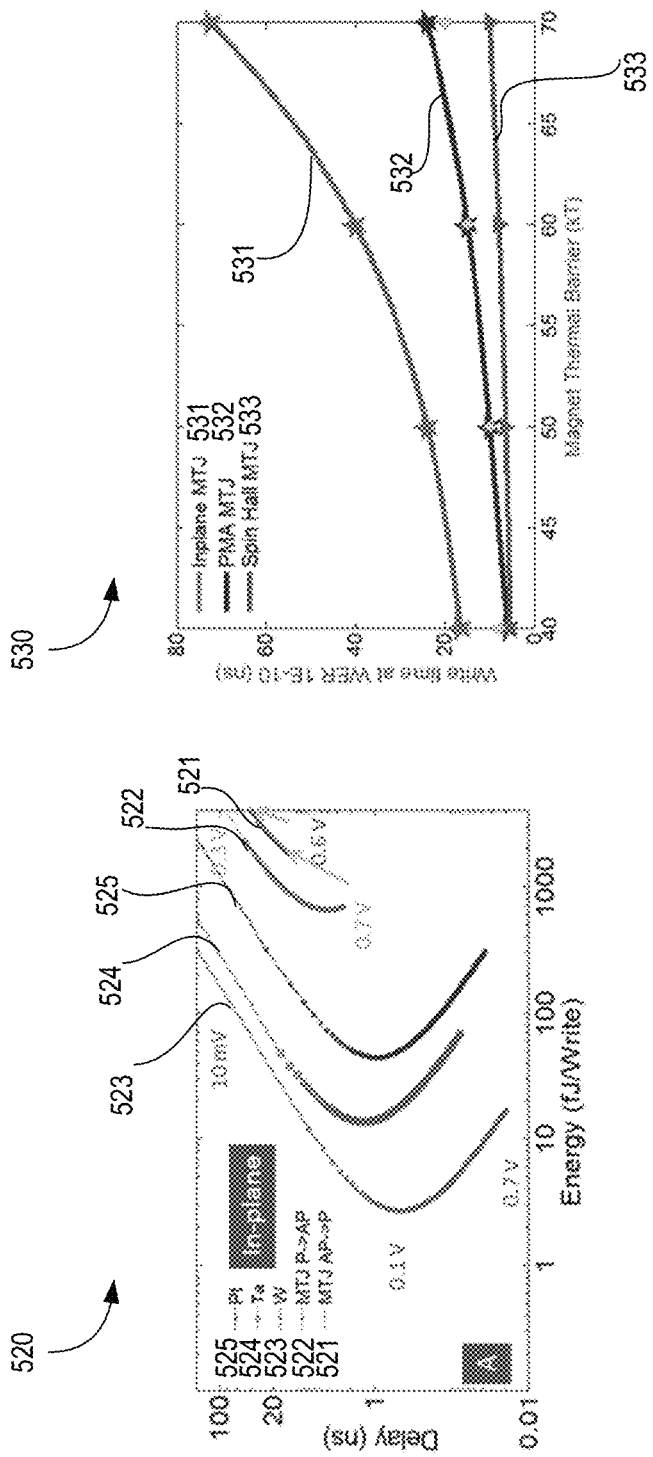
FIG. 5A illustrates a plot showing write energy-delay conditions for one transistor and one MTJ with top spin orbit coupling electrode with selector (e.g., device of FIG. 2A) compared to traditional MTJs with bottom MTJ with bottom spin orbit coupling electrode, in accordance with some embodiments.
FIG. 5B illustrates a plot comparing reliable write times for spin Hall MRAM and spin torque MRAM with top spin orbit coupling node and selector.

FIG. 5A illustrates plot 520 showing write energy-delay conditions for one transistor and one MTJ with top spin orbit coupling electrode with selector (e.g., device of FIG. 2A) compared to traditional MTJs with bottom MTJ with bottom spin orbit coupling electrode, in accordance with some embodiments. Here, the x-axis is energy per write operation in femto-Joules (fJ) while the y-axis is delay in nanoseconds (ns).

Here, the energy-delay trajectory of SHE and MTJ devices (e.g., device 200) are compared for in-plane magnet switching as the applied write voltage is varied. The energy-delay relationship (for in-plane switching) can be written as:

$$E(\tau) = R_{write} I_{co}^2 \frac{\left(\tau + \tau_0 \ln\left(\frac{\pi}{2\theta_0}\right)\right)^2}{\tau} = \frac{4}{h^2} \frac{R_{write}}{P^2} \frac{1}{\tau}\left(\mu_0 e\alpha \frac{M_s}{2}\left(\tau + \tau_0 \ln\left(\frac{\pi}{2\theta_0}\right)\right)^2\right) W$$

where $R_{write}$ is the write resistance of the device (resistance of SHE electrode or resistance of MTJ-P or MTJ-AP, where MTJ-P is a MTJ with parallel magnetization while MTJ-AP is an MTJ with anti-parallel magnetization, $\mu_0$ is vacuum permeability, e is the electron charge. The equation shows that the energy at a given delay is directly proportional to the square of the Gilbert damping $\alpha$. Here the characteristic time, $\tau_0 = M_s Ve/I_c P\mu_B$ varies as the spin polarization varies for various SHE metal electrodes (e.g., 523, 524, 525). Plot 520 shows five curves 521, 522, 523, 524, and 525. Curves 521 and 522 show write energy-delay conditions using traditional MTJ devices without SHE material.

For example, curve 521 shows the write energy-delay condition caused by switching a magnet from anti-parallel (AP) to parallel (P) state, while curve 522 shows the write energy-delay condition caused by switching a magnet from P to AP state. Curves 522, 523, and 524 show write energy-delay conditions of an MTJ with SHE material. Clearly, write energy-delay conditions of an MTJ with SHE material (e.g., one of device 200 or 300) is much lower than the write energy-delay conditions of an MTJ without SHE material (device not shown). While the write energy-delay of an MTJ with SHE material (e.g., device 200) improves over a traditional MTJ without SHE material, further improvement in write energy-delay is desired.

FIG. 5B illustrates plot 530 comparing reliable write times for spin Hall MRAM and spin torque MRAM with top spin orbit coupling node and selector. There are three cases considered in plot 530. Waveform 531 is the write time for in-plane MTJ, waveform 532 is the write time for PMA MTJ, and waveform 533 is the write time for spin Hall MTJ. The cases considered here assume a 30×60 nm magnet with 40 kT energy barrier and 3.5 nm SHE electrode thicknesses. The energy-delay trajectories of the devices are obtained assuming a voltage sweep from 0 V to 0.7 V in accordance to voltage restrictions of scaled CMOS. The energy-delay trajectory of the SHE-MTJ devices exhibits broadly two operating regions A) Region 1 where the energy-delay product is approximately constant ($\tau_d < M_s Ve/I_c P\mu_B$), B), and Region 2 where the energy is proportional to the delay $\tau_d > M_s Ve/I_c P\mu_B$. The two regions are separated by energy minima at $\tau_{opt} = M_s Ve/I_c P\mu_B$ where minimum switching energy is obtained for the spin torque devices.

The energy-delay trajectory of the STT-MTJ (spin transfer torque MTJ) devices is limited with a minimum delay of 1 ns for in-plane devices at 0.7 V maximum applied voltage, the switching energy for P-AP and AP-P are in the range of 1 pJ/write. In contrast, the energy-delay trajectory of SHE- MTJ (in-plane anisotropy) devices can enable switching times as low as 20 ps (β-W with 0.7 V, 20 fJ/bit) or switching energy as small as 2 fJ (β-W with 0.1 V, 1.5 ns switching time).

Figure 6:
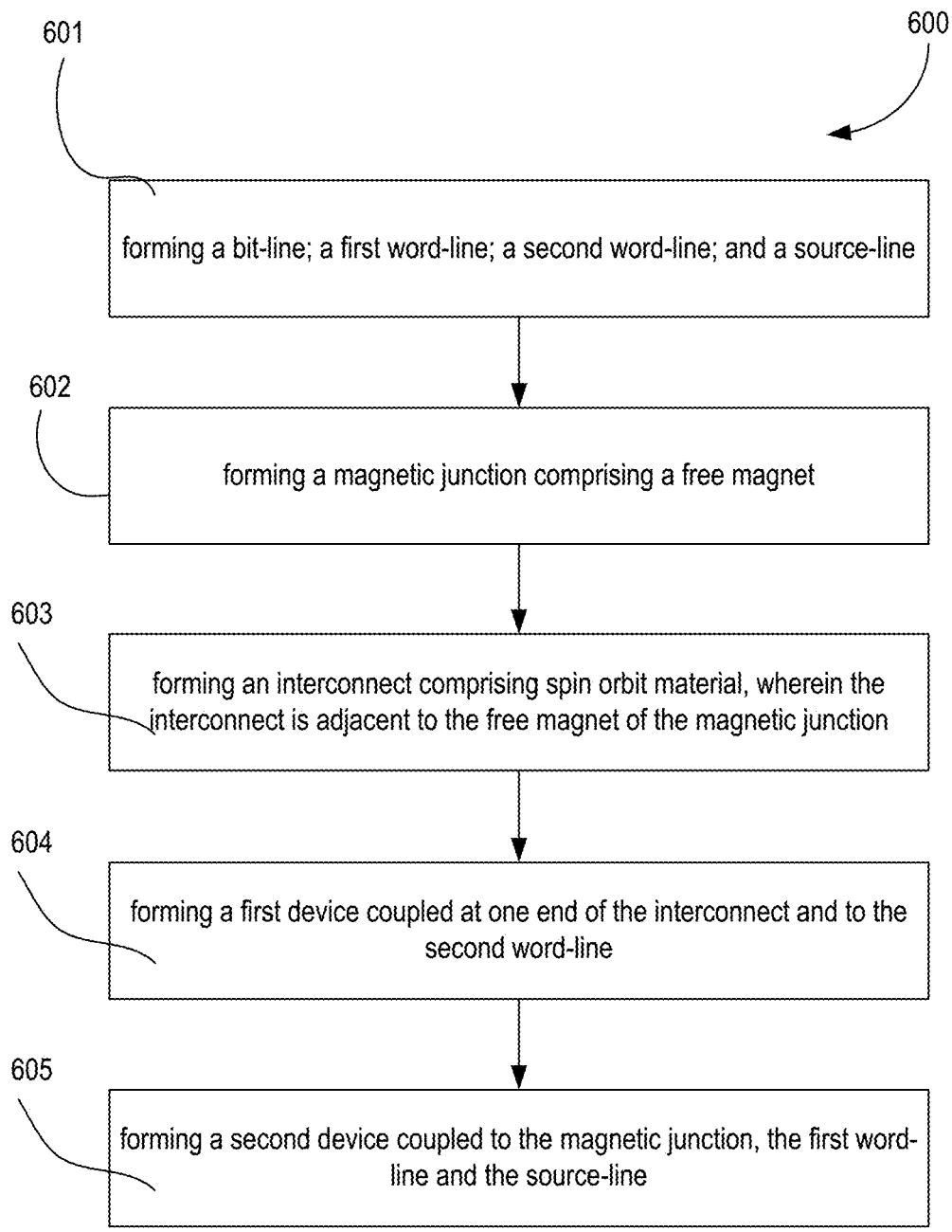
FIG. 6 illustrates a flowchart of a method for forming SOT memory device (e.g., device of FIG. 2A) having top spin orbit coupling electrode with selector, in accordance with some embodiments.

FIG. 6 illustrates a flowchart 600 of a method for forming SOT memory device (e.g., device of FIG. 2A) having top spin orbit coupling electrode with selector, in accordance with some embodiments. Various blocks of flowchart 600 can be performed in any suitable order. For example, some blocks can be performed before others, and some blocks can be performed simultaneously with others.

At block 601, control lines such as bit-line (BL), first word-line ($WL_1$), second word-line ($WL_2$); and a source-line (SL) are formed. At block 602, a magnetic junction 221 is formed comprising a free magnet 221a. In some embodiments, the free magnet has perpendicular magnetization relative to a plane of a device.

At block 603, an interconnect 222 is formed comprising spin orbit material, wherein the interconnect is adjacent to the free magnet of the magnetic junction. In some embodiments, the interconnect is positioned in a backend-of-line (BEOL) of a die or near the BEOL of the die, and wherein the magnetic junction is closer to a frontend-of-line (FEOL) of the die compared to the interconnect.

At block 604, a first device (e.g., selector 250) is formed. The first device is coupled at one end of the interconnect and to the second word-line. In some embodiments, the first device is a two-terminal selector device comprising metal and oxygen. In some embodiments, the first device includes one or more of: Pt, Te, Mo, Se, S, O, Ti, Zn, In, Ga, Rh, Nb, or Sn.

At block 605, a second device (e.g., transistor MN) is formed. In some embodiments, the second device is coupled to the magnetic junction, the first word-line and the source-line.

Figure 7:
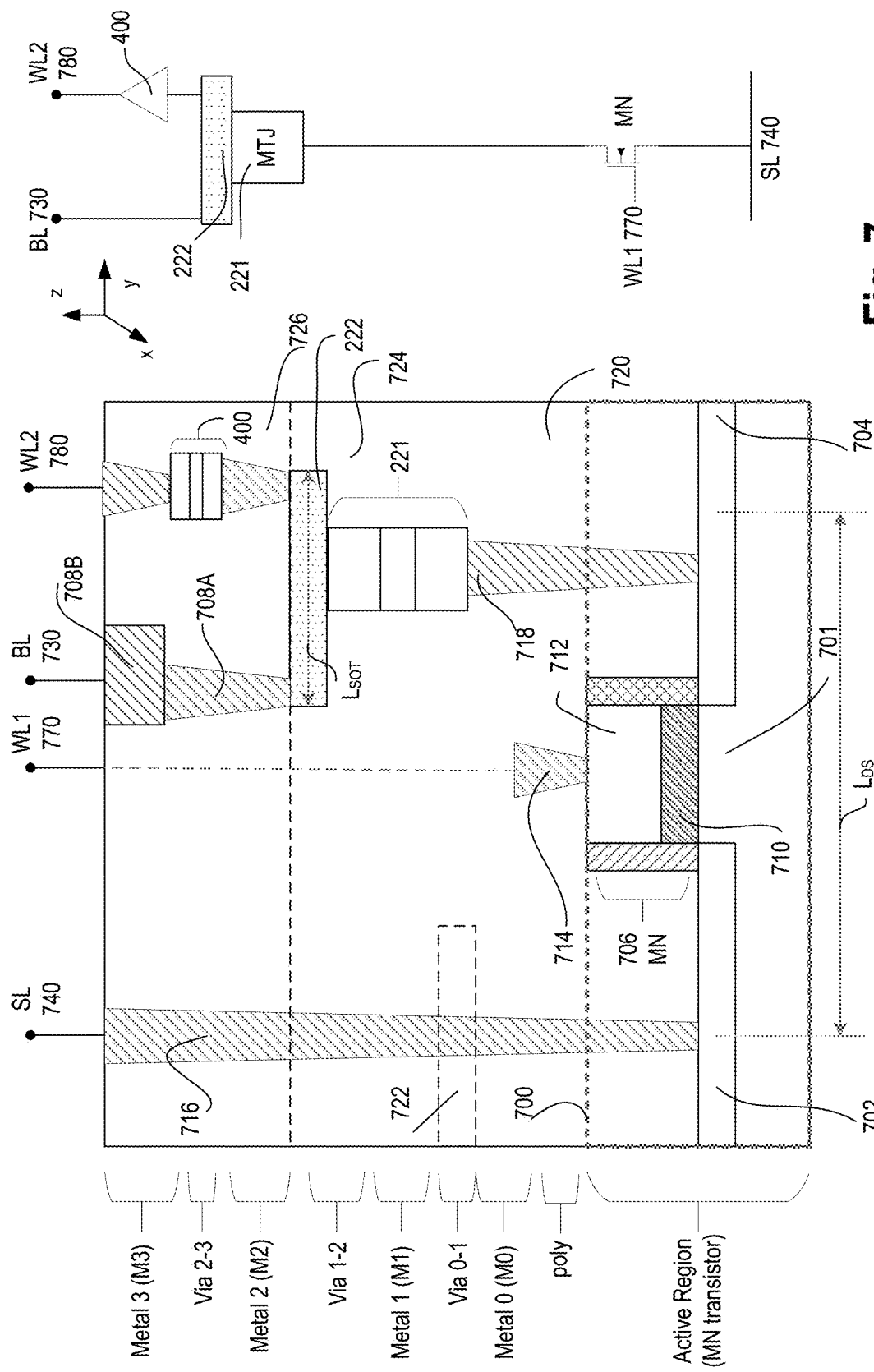
FIG. 7 illustrates a cross-sectional view of a SOT memory device (e.g., device of FIG. 2A) having top spin orbit coupling electrode with selector, according to some embodiments.

FIG. 7 illustrates a cross-sectional view of a SOT memory device (e.g., device of FIG. 2A) having top spin orbit coupling electrode with selector, according to some embodiments. In an embodiment, the transistor 700 is disposed on a substrate 701.

In an embodiment, the transistor 700 has a source region 702, a drain region 704 and a gate 706. The transistor 700 (e.g., n-type transistor MN) further includes a gate contact 714 disposed above and electrically coupled to the gate 706, a source contact 716 disposed above and electrically coupled to the source region 702, and a drain contact 718 disposed above and electrically coupled to the drain region 704 as is illustrated in FIG. 7. In some embodiments, a SOT memory device such as a SOT memory device 200 is disposed above the transistor 700.

In some embodiments, the SOT memory device 200 includes a top spin orbit torque electrode, such as spin orbit torque electrode 222, a magnetic tunnel junction memory device such as MTJ 221 disposed below the spin orbit torque electrode 222, and a conductive interconnect structure such as conductive interconnect structure 708 (e.g., structure 708A/B) disposed on and coupled to the spin orbit torque electrode 222. In some embodiments, the MTJ 221 is disposed on the drain contact 718 of the transistor 700.

In some embodiments, the MTJ memory device 200 (e.g., which includes 221) includes individual functional layers that are described in association with FIGS. 2-3. In some embodiments, the spin orbit torque electrode 222 has a length, $L_{SOT}$ that is less than a distance of separation, $L_{DS}$ between the drain contact 718 and the source contact 716. In some embodiments, a portion of the spin orbit torque electrode 222 extends above the gate electrode 712 and the gate contact 714. In some embodiments, a portion of the spin orbit torque electrode 222 extends over the gate electrode 712. In some embodiments, the spin orbit torque electrode 222 is in a first y-z plane.

In some embodiments, the gate contact 714 is directly below the spin orbit torque electrode 222. In some embodiments, a first word-line ($WL_1$) contact is disposed onto the gate contact 714 on a second y-z plane behind (into the page) the first y-z plane of the spin orbit torque electrode 222. In some embodiments, the spin orbit torque electrode 222 that may not contact the word-line contact is disposed on the gate electrode 712.

In some embodiments, transistor 700 associated with substrate 701 is a metal-oxide-semiconductor field-effect transistor (MOSFET or simply MOS transistors), fabricated on the substrate 701. In various embodiments of the present disclosure, the transistor 700 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the transistor 700 is a tri-gate transistor.

In some embodiments, a voltage $V_{DS}$ is applied between the bit-line (BL) 730 and the source-line (SL) 740 and the first word-line 770 is energized above a threshold voltage, $V_{TH}$ on the transistor 700. In some embodiments, an electron current (spin hall current) flows through the spin orbit torque electrode 222 and causes a spin diffusion current to flow toward the MTJ memory device 200. The spin diffusion current exerts a torque on the magnetization of the free magnet 221a of MTJ 221.

In some embodiments, by applying a voltage $V_{DS}$ between bit-line 730 and source-line 740, current can flow through the MTJ memory device 200. In some embodiments, a voltage $V_{DS}$ that is equal to or greater than the threshold voltage $V_{TS}$ is enough to generate spin polarized current through the MTJ 221. In some embodiments, the spin transfer torque current flowing through the MTJ 221 also imparts torque to the free magnet 221a adding to the torque from the spin diffusion current. In some embodiments, the combined effect of the spin transfer torque and the spin diffusion torque can switch the magnetization of the free magnet 221a. In some embodiments, by reversing the polarity of the voltage $V_{DS}$, and applying a voltage that meets or exceeds a threshold voltage, the direction of magnetization of the free magnet 221a is switched back to a previous configuration.

In some embodiments, by applying a voltage between a bit-line 730 and source-line 740, and by applying a voltage above a threshold voltage, $V_{TH}$ on the first word-line 770 of the transistor 700, the MTJ memory device 200 can undergo magnetization switching without the need for an additional voltage source (e.g. a second transistor). In some embodiments, implementing a SOT memory device 200 above a transistor can increase the number of SOT memory devices 200 in a given area of a die by at least a factor of two. In some embodiments, selector device 400 is coupled to another end of the SOT electrode 222 and the second word-line ($WL_2$) 780.

In some embodiments, the underlying substrate 701 represents a surface used to manufacture integrated circuits. In some embodiments, the substrate 701 includes a suitable semiconductor material such as but not limited to, single crystal silicon, polycrystalline silicon and silicon on insulator (SOI). In another embodiment, the substrate 701 includes other semiconductor materials such as germanium, silicon germanium, or a suitable group III-V or group III-N compound. The substrate 701 may also include semiconductor materials, metals, dopants, and other materials commonly found in semiconductor substrates.

In some embodiments, the transistor 700 includes a gate stack formed of at least two layers, a gate dielectric layer 710 and a gate electrode layer 712. The gate dielectric layer 710 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 710 to improve its quality when a high-k material is used.

The gate electrode layer 712 of the transistor 700 is formed on the gate dielectric layer 710 and may comprise of at least one P-type work-function metal or N-type work-function metal, depending on whether the transistor is to be a PMOS or an NMOS transistor. In some embodiments, the gate electrode layer 712 may comprise of a stack of two or more metal layers, where one or more metal layers are work-function metal layers and at least one metal layer is a conductive fill layer.

For a PMOS transistor, metals that may be used for the gate electrode layer 712 include, but are not limited to, ruthenium, palladium, platinum, cobalt, nickel, and conductive metal oxides, e.g., ruthenium oxide. A P-type metal layer will enable the formation of a PMOS gate electrode layer 712 with a work-function that is between about 4.9 eV and about 5.2 eV. For an NMOS transistor, metals that may be used for the gate electrode layer 712 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 712 with a work-function that is between about 3.9 eV and about 4.2 eV.

In some embodiments, the gate electrode layer 712 may comprise a "U"-shaped structure that includes a bottom portion substantially parallel to the surface of the substrate and two sidewall portions that are substantially perpendicular to the top surface of the substrate. In another embodiment, at least one of the metal layers that form the gate electrode layer 712 may simply be a planar layer that is substantially parallel to the top surface of the substrate and does not include sidewall portions substantially perpendicular to the top surface of the substrate. In some embodiments of the present disclosure, the gate electrode layer 712 may comprise of a combination of U-shaped structures and planar, non-U-shaped structures. For example, the gate electrode layer 712 may comprise of one or more U-shaped metal layers formed atop one or more planar, non-U-shaped layers.

In some embodiments, a pair of gate dielectric layer 710 may be formed on opposing sides of the gate stack that bracket the gate stack. The gate dielectric layer 710 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 702 and drain region 704 are formed within the substrate adjacent to the gate stack of the transistor 700. The source region 702 and drain region 704 are generally formed using either an implantation/diffusion process or an etching/deposition process. In the former process, dopants such as boron, aluminum, antimony, phosphorous, or arsenic may be ion-implanted into the substrate to form the source region 702 and drain region 704. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 702 and drain region 704. In some embodiments, the source region 702 and drain region 704 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 702 and drain region 704 may be formed using one or more alternate semiconductor materials such as germanium or a suitable group III-V compound. In some embodiments, one or more layers of metal and/or metal alloys may be used to form the source region 702 and drain region 704.

In some embodiments, the gate contact 714 and drain contact 718 of the transistor 700 are disposed in a first dielectric layer 720 disposed above the substrate 701. In some embodiments, the spin orbit torque electrode 222 is disposed in a second dielectric layer 722 disposed on the first dielectric layer 720. In some embodiments, a third dielectric layer 724 is disposed on the second dielectric layer 722. In some embodiments, a fourth dielectric layer 726 is disposed on the third dielectric layer 724. In some embodiments, a source contact 716 is partially disposed in the fourth dielectric layer 726, partially disposed in the third dielectric layer 724, partially disposed in the second dielectric layer 722 and partially disposed on the first dielectric layer 720. In some embodiments, the spin orbit torque electrode contact is disposed in the third dielectric layer 724 on the spin orbit torque electrode 222. In some embodiments, the conductive interconnect structure such as conductive interconnect structure 708a/b disposed in the fourth dielectric layer 726.

In some embodiments, the gate contact 714 is formed in poly region; drain contact 718 is formed in active, poly, and Metal 0 (M0); SOT or SHE electrode 222 is formed in Via 0-1 layer; MTJ 221/321/421 is formed in Metal 1 (M1) and Via 1-2; contact 708a is formed in Metal 2 (M2) and Via 2-3; and conductor 708B is formed in Metal 3 (M3).

In some embodiments, the magnetic junction (e.g., MTJ 221 or spin valve) is formed in the metal 3 (M3) region. In some embodiments, the free magnet layer 221a of the magnetic junction 221 couples to spin Hall electrode 222. In some embodiments, the fixed magnet layer 221c of magnetic junction 221 couples to drain of transistor MN through via 718.

In some embodiments, an n-type transistor MN is formed in the frontend of the die while the spin Hall electrode 222 is located in the backend of the die. Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layers 5 and below in the ten-metal stack die example). In some embodiments, the spin Hall electrode 222 is located in the backend metal layers or via layers for example in Via 3. In some embodiments, the electrical connectivity to the device is obtained in layers MO and M4 or M1 and M5 or any set of two parallel interconnects. In some embodiments, the MTJ 221 is formed in metal 2 (M2) and metal 1 (M1) layer region and/or Via 1-2 region. In some embodiments, the spin Hall electrode 222 is formed in the metal 1 region.

FIG. 8A illustrates a plot 800 showing spin polarization capturing switching of a free magnet comprising a stack including a fixed magnet with in-plane magnetization positioned between free magnets with perpendicular magnetization, according to some embodiments of the disclosure. FIG. 8B illustrates a magnetization plot 820 associated with FIG. 8A, according to some embodiments of the disclosure.

Plot 800 shows switching of the spin orbit torque device with PMA such as device 200 of FIG. 2A. Here, waveforms 801, 802, and 803 represent the magnetization projections on the x, y, and z axes, respectively. The magnet starts with z-magnetization of −1. Positive SOT is applied from 5 ns (nanoseconds) to 50 ns. It leads to switching the z magnetization to 1. Then, a negative spin orbit torque is applied between 120 ns and 160 ns, which leads to switching the z-magnetization to 1. This illustrates change of magnetization in response to write charge current of certain polarity.

FIG. 8C illustrates a plot 830 showing spin polarization capturing switching of the free magnet stack using spin orbit material, according to some embodiments of the disclosure. FIG. 8D illustrates a magnetization plot 840 associated with FIG. 8C, according to some embodiments of the disclosure. Here, waveforms 831, 832, and 833 represent the magnetization projections on x, y, and z axes, respectively. The difference from the case of FIG. 8C is that negative SOT is applied from 5 ns to 50 ns. As a result, the z-magnetization remains close to −1. This illustrates the persistence of magnetization in response to write charge current of opposite polarity.

Figure 8:
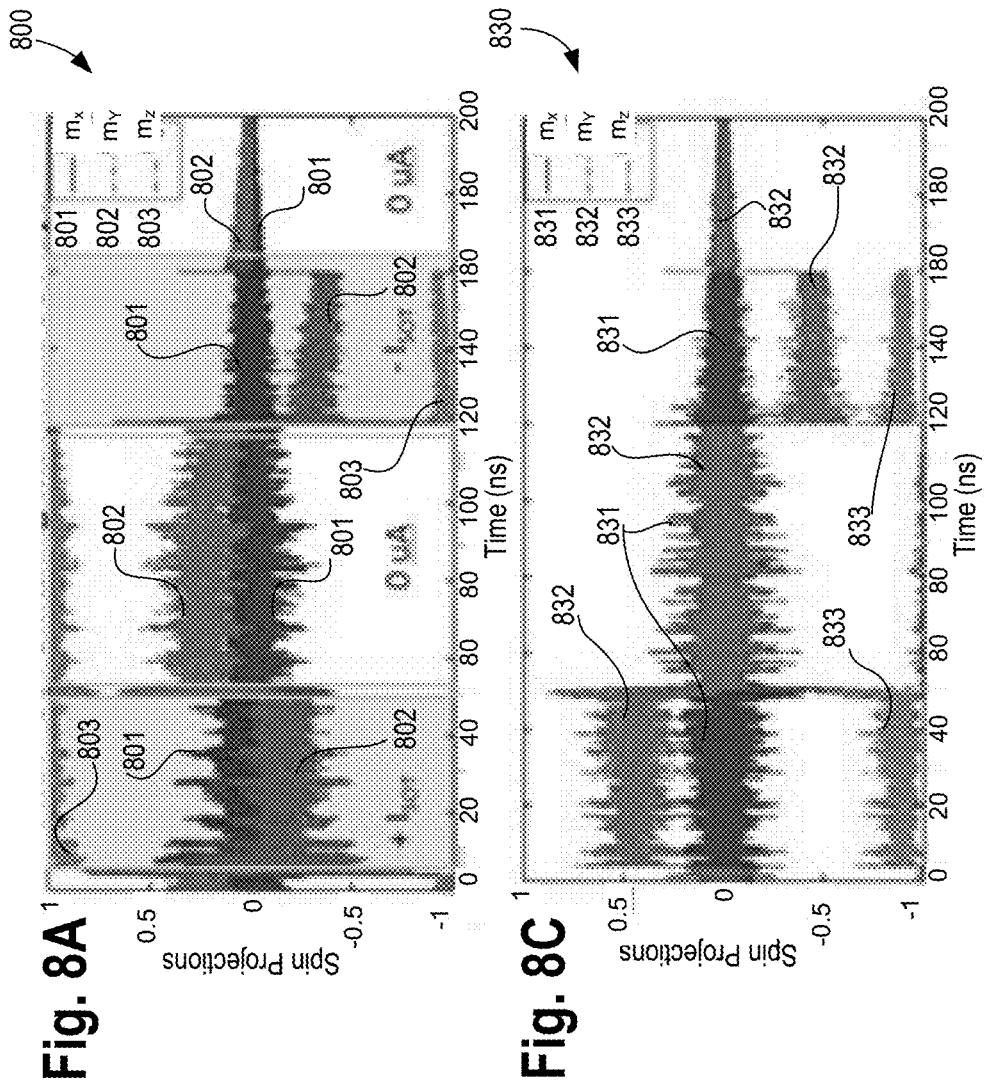
FIG. 8A illustrates a plot showing spin polarization capturing switching of a free magnet comprising a stack including a fixed magnet with in-plane magnetization positioned between free magnets with perpendicular magnetization, according to some embodiments of the disclosure.
FIG. 8B illustrates a magnetization plot associated with FIG. 8A, according to some embodiments of the disclosure.
FIG. 8C illustrates a plot showing spin polarization capturing switching of the free magnet stack using spin orbit material, according to some embodiments of the disclosure.
FIG. 8D illustrates a magnetization plot associated with FIG. 8C, according to some embodiments of the disclosure.
Figure 9:
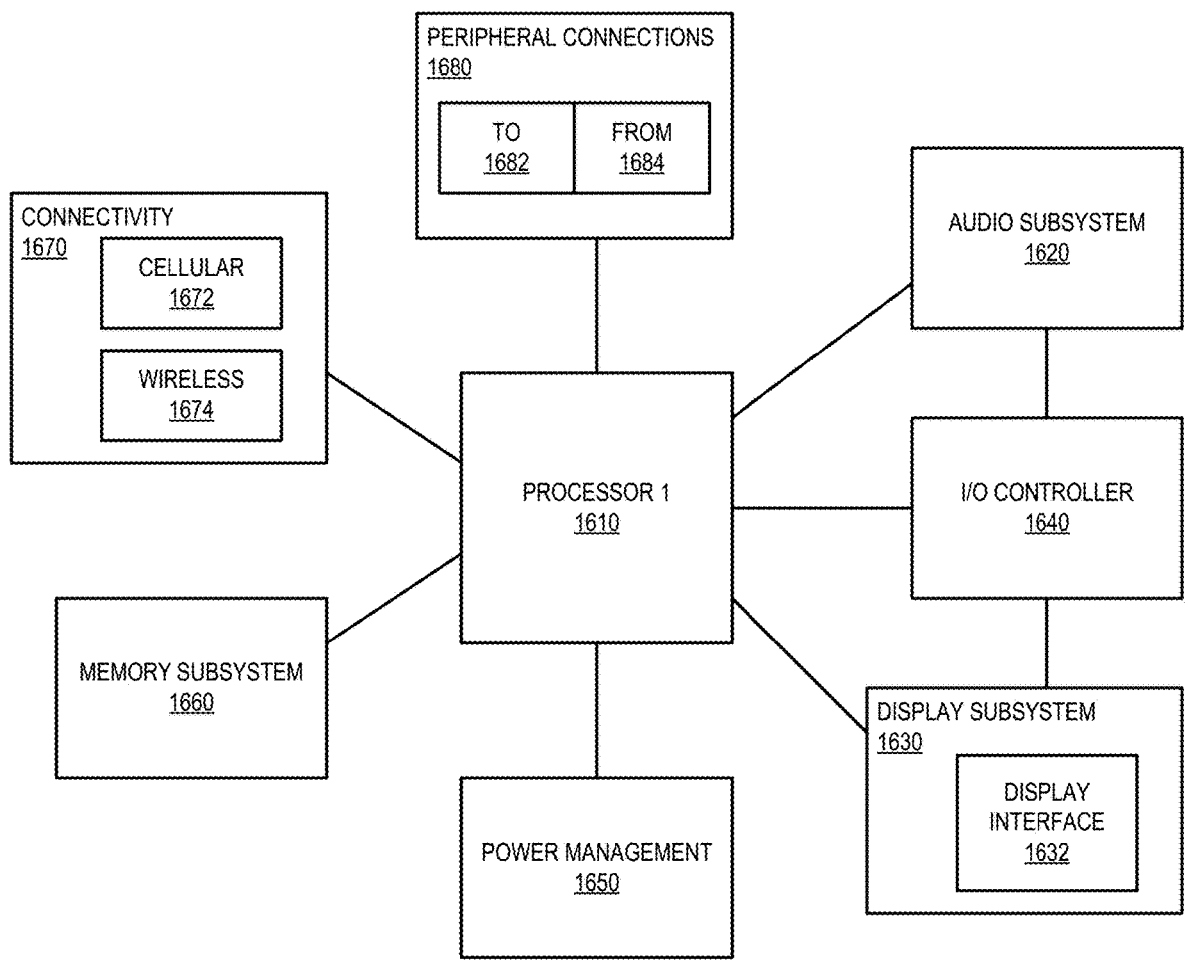
FIG. 9 illustrates a smart device or a computer system or a SoC (System-on-Chip) with pSOT device having top spin orbit coupling electrode with selector, according to some embodiments.

FIG. 9 illustrates a smart device or a computer system or a SoC (System-on-Chip) with pSOT device having top spin orbit coupling electrode with selector, according to some embodiments. FIG. 8 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with pSOT device having top spin orbit coupling electrode with selector such as those described in FIGS. 2-5, according to some embodiments discussed. Other blocks of the computing device 1600 may also include pSOT device(s) having top spin orbit coupling electrode with selector such as those described in FIGS. 2-5, according to some embodiments. The various embodiments of the present disclosure may also comprise a network interface within connectivity 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a bit-line; a first word-line; a second word-line; and a source-line;
a magnetic junction comprising a free magnet;
an interconnect comprising spin orbit material, wherein the interconnect is adjacent to the free magnet of the magnetic junction;
a first device coupled at one end of the interconnect, wherein the first device is coupled to the second word-line; and
a second device coupled to the magnetic junction, the first word-line, and the source-line, wherein the first device is a two-terminal selector device comprising metal and oxygen.

2. The apparatus of claim 1, wherein the two-terminal selector device comprises:
a first structure comprising metal;
a second structure comprising oxygen; and
a third structure comprising metal, wherein the second structure is between the first and third structures.

3. The apparatus of claim 1, wherein the interconnect is positioned in a backend-of-line (BEOL) of a die or near the BEOL of the die, and wherein the magnetic junction is closer to a frontend-of-line (FEOL) of the die compared to the interconnect.

4. The apparatus of claim 1, wherein the free magnet has perpendicular magnetization relative to a plane of the apparatus.

5. The apparatus of claim 1, wherein the free magnet comprises a material comprising one or more of Co, Fe, Ni, or O.

6. The apparatus of claim 1, wherein the free magnet is one of a paramagnet or a ferromagnet.

7. The apparatus of claim 1, comprising:
a processor;
a memory coupled to the processor, the memory comprising the bit-line, first and second word- lines, and source-line, magnetic junction, interconnect, and first and second devices; and
a wireless interface to allow the processor to communicate with another device.

8. An apparatus, comprising: a bit-line; a first word-line; a second word-line; and a source-line; a magnetic junction comprising a free magnet; an interconnect comprising spin orbit material, wherein the interconnect is adjacent to the free magnet of the magnetic junction; a first device coupled at one end of the interconnect, wherein the first device is coupled to the second word-line; and a second device coupled to the magnetic junction, the first word-line, and the source-line, wherein the first device comprises one or more of Pt, Te, Mo, Se, S, Ti, Zn, In, Ga, Rh, Nb, or Sn.

9. The apparatus of claim 8, wherein the first device comprises:
a first structure comprising metal;
a second structure comprising oxygen; and
a third structure comprising metal, wherein the second structure is between the first and third structures.

10. The apparatus of claim 8, wherein the interconnect is positioned in a backend-of-line (BEOL) of a die or near the BEOL of the die, and wherein the magnetic junction is closer to a frontend-of-line (FEOL) of the die compared to the interconnect.

11. The apparatus of claim 8, wherein the free magnet has perpendicular magnetization relative to a plane of the apparatus.

12. The apparatus of claim 8, wherein the free magnet comprises a material comprising one or more of Co, Fe, Ni, or O.

13. The apparatus of claim 8, wherein the free magnet is one of a paramagnet or a ferromagnet.

14. The apparatus of claim 8, comprising:
a processor;
a memory coupled to the processor, the memory comprising the bit-line, first and second word- lines, and source-line, magnetic junction, interconnect, and first and second devices; and
a wireless interface to allow the processor to communicate with another device.

15. An apparatus, comprising:
a bit-line; a first word-line; a second word-line; and a source-line;
a magnetic junction comprising a free magnet;
an interconnect comprising spin orbit material, wherein the interconnect is adjacent to the free magnet of the magnetic junction;
a first device coupled at one end of the interconnect, wherein the first device is coupled to the second word-line; and
a second device coupled to the magnetic junction, the first word-line, and the source-line, wherein the interconnect is positioned in a backend-of-line (BEOL) of a die or near the BEOL of the die, and wherein the magnetic junction is closer to a frontend-of-line (FEOL) of the die compared to the interconnect.

16. The apparatus of claim 15, wherein the first device comprises:
a first structure comprising metal;
a second structure comprising oxygen; and
a third structure comprising metal, wherein the second structure is between the first and third structures.

17. The apparatus of claim 15, wherein the free magnet has perpendicular magnetization relative to a plane of the apparatus.

18. The apparatus of claim 15, wherein the free magnet comprises a material comprising one or more of Co, Fe, Ni, or O.

19. The apparatus of claim 15, wherein the free magnet is one of a paramagnet or a ferromagnet.

20. The apparatus of claim 15, comprising:
a processor;
a memory coupled to the processor, the memory comprising the bit-line, first and second word- lines, and source-line, magnetic junction, interconnect, and first and second devices; and
a wireless interface to allow the processor to communicate with another device.

* * * * *